US012672421B2

(12) United States Patent
Zhao et al.

(10) Patent No.: US 12,672,421 B2
(45) Date of Patent: Jun. 30, 2026

(54) PEROVSKITE SOLAR CELL MODIFIED BY CHELATING LAYER AND ITS PREPARATION METHOD

(71) Applicant: Nanjing University of Aeronautics and Astronautics, Nanjing City (CN)

(72) Inventors: Xiaoming Zhao, Nanjing City (CN);
Wanlin Guo, Nanjing City (CN);
Bingkun Tian, Nanjing City (CN);
Zhuhua Zhang, Nanjing City (CN)

( * ) Notice: Subject to any disclaimer, the term of this patent is extended or adjusted under 35 U.S.C. 154(b) by 81 days.

(21) Appl. No.: 18/829,313

(22) Filed: Sep. 10, 2024

(65) Prior Publication Data

US 2025/0098396 A1      Mar. 20, 2025

(30) Foreign Application Priority Data

Sep. 15, 2023    (CN) .......................... 202311196998.2

(51) Int. Cl.
  *H10K 30/88*        (2023.01)
  *H10K 30/40*        (2023.01)
  *H10K 71/12*        (2023.01)

(52) U.S. Cl.
  CPC ............. *H10K 30/88* (2023.02); *H10K 30/40* (2023.02); *H10K 71/12* (2023.02)

(58) Field of Classification Search
  None
  See application file for complete search history.

(56) References Cited

U.S. PATENT DOCUMENTS

2004/0099305 A1*   5/2004  Heller .................... H10K 71/60
                                                   136/263

* cited by examiner

*Primary Examiner* — Eli S Mekhlin

(57) ABSTRACT

The invention relates to a perovskite solar cell modified by a chelating layer and its preparation method, within the field of perovskite material preparation. The process involves spin-coating N, N'-bis(4-pyridyl)-1,4,5,8-naphthalenetetrac-arboxylic diimide (DPNDI) solution on the perovskite surface, followed by annealing. This modification forms a chelating structure on the surface, passivating defect sites and grain boundaries, promoting charge transfer with optimized energy levels and carrier mobility. The Pb (II) coordination polymer layer enhances bonding strength and adhesion, effectively suppressing traps. The treated perovskite solar cell achieves a photoelectric conversion efficiency (PCE) of 24.2%, with a T80 lifetime retaining over 95% (40° C.) and 85% (85° C.) of the initial PCE after 2000 hours. This modified film inhibits ion migration, providing enhanced stability and high photoelectric conversion efficiency in optoelectronic devices.

7 Claims, 10 Drawing Sheets

PEROVSKITE SOLAR CELL MODIFIED BY CHELATING LAYER AND ITS PREPARATION METHOD

TECHNICAL FIELD

The invention belongs to the field of preparation technology of perovskite material, specifically relates to a perovskite solar cell modified by chelating layer and its preparation method.

BACKGROUND ART

The photoelectric conversion efficiency of perovskite solar cells (PSCs) is comparable to that of commercial silicon cells and inorganic thin film solar cells, which makes it one of the most promising photoelectric materials. However, the perovskite light-absorption layer is easy to degrade in the environment, which causes the output performance decay of PSCs during the long-term service and severely limits its commercial development.

The degradation of perovskite generally starts from the defect sites at the surface and grain boundaries, which not only lead to the loss of non-radiative charge recombination, but also reduce the operational stability of perovskite solar cells. Therefore, it is very important to improve the output performance and long-term stability of perovskite solar cells by a simple and effective method to eliminate these defects. At present, a large number of materials have been developed in the experiments to passivate the surface defects of perovskite. Among them, organic halides can combine with the defect sites at the surface and grain boundaries of perovskite and form tunnel junction with the charge extraction layer to reduce non-radiative recombination. However, the charge transport capacity of large halide ions in the organic layer is often poor, and it is easy to form a charge extraction barrier, so as to inhibit the effective operation of photoelectric device.

An effective strategy to overcome the above challenges is to develop the ligand with dual functions, which can not only form a new structure with perovskite to passivate these surface defects, but also have matching energy level and carrier mobility to promote the interface charge transfer. Consequently, this approach enhances the photoelectric conversion efficiency of PSCs while preserving their operational stability.

SUMMARY OF THE INVENTION

In view of the above defects and actual needs of the existing technology, the invention provides a perovskite solar cell modified by chelating layer and its preparation method. The purpose of the invention is to use the strong coordination ability of pyridine and metal ions in the perovskite layer to form a layer of Pb (II) coordination polymer with strong chemical bond on the surface of the perovskite, so as to achieve the effect of passivating the defects of the perovskite surface and promoting the interface charge transfer, thereby improving the photoelectric conversion efficiency and operating stability of the perovskite solar cells.

To achieve the above purpose, the invention provides the following technical scheme:

A perovskite solar cell modified by chelating layer and its preparation method, comprising the following steps:

Spin-coating N, N'-bis(4-pyridyl)-1,4,5,8-naphthalenetetracarboxylic diimide (DPNDI) solution on the surface of halide perovskite and annealing the surface.

A core functional layer of the perovskite solar cell can be a formal structure and an inverted structure, an arrangement order of the formal structure is electron transport layer, perovskite light-absorption layer and hole transport layer from bottom to top; the arrangement order of the inverted structure is hole transport layer, perovskite light-absorption layer and electron transport layer from bottom to top.

Further, the perovskite comprises all 2D and 3D halide perovskites.

A structure of 2D halide perovskite is $A'_m A_{n-1} B_n X_{3n+1}$, wherein A' represents a monovalent or divalent organic cation that separates one group of perovskite layers from another group of perovskite layers, and n is an integer denoting a number of perovskite layers between A' organic layers. A is one or more of Cs, MA, FA, B is one or more of Pb, Sn, Ge, X is one or more of I, Br, Cl, F.

A structure of 3D halide perovskite is $ABX_3$, wherein A is one or more of Cs, MA and FA, B is one or more of Pb, Sn and Ge, and X is one or more of I, Br, Cl and F.

Further, a solvent selected form DPNDI solution comprise but is not limited to one or more of chlorobenzene, ethyl acetate, and anisole; a concentration of the solution is 1-10 mg/mL.

Further, a spin-coating speed is 1000-10000 rpm.

Further, an annealing temperature is 30-200° C., and an annealing time is 1-10 min.

In general, compared with the existing technology, the beneficial effects of the invention are:

Conventional perovskite solar cells suffer from the drawbacks of surface degradation and poor operational stability. The invention adopts a surface stabilization strategy, which achieves the dual beneficial effects of passivating the defects of perovskite surface and promoting the interface charge transfer by forming a chelating structure on the perovskite surface. Thanks to the strong chemical bond and matching energy level of the lead chelating coordination, the prepared photoelectric device has the advantages of high photoelectric conversion efficiency and high operating stability.

The formed chelating structure is based on the modified perovskite surface of the invention, it is beneficial to passivate the defect sites at the surface and grain boundaries, and it has appropriate energy level and carrier mobility to promote interface charge transfer. At the same time, the Pb (II) coordination polymer layer with strong chemical bond can improve the bonding strength and adhesion of the perovskite surface, which show a strong trap suppression ability. The photoelectric conversion efficiency (PCE) of the treated perovskite solar cell can reach 24.2%, and its $T_{80}$ lifetime is more than 95% (40° C.) and 85% (85° C.) of the initial PCE after 2000 hours of operation. The modified perovskite film based on the invention can effectively inhibit ion migration; and the corresponding photoelectric device has the advantages of strong stability and high photoelectric conversion efficiency.

The surface stabilization strategy used in this invention only needs to spin-coat a layer of DPNDI solution on the perovskite surface, its process of operation is simple and its cost is low. The prepared perovskite solar cells have the potential for commercial application.

DETAILED DESCRIPTION OF THE EMBODIMENTS

Figure 1:
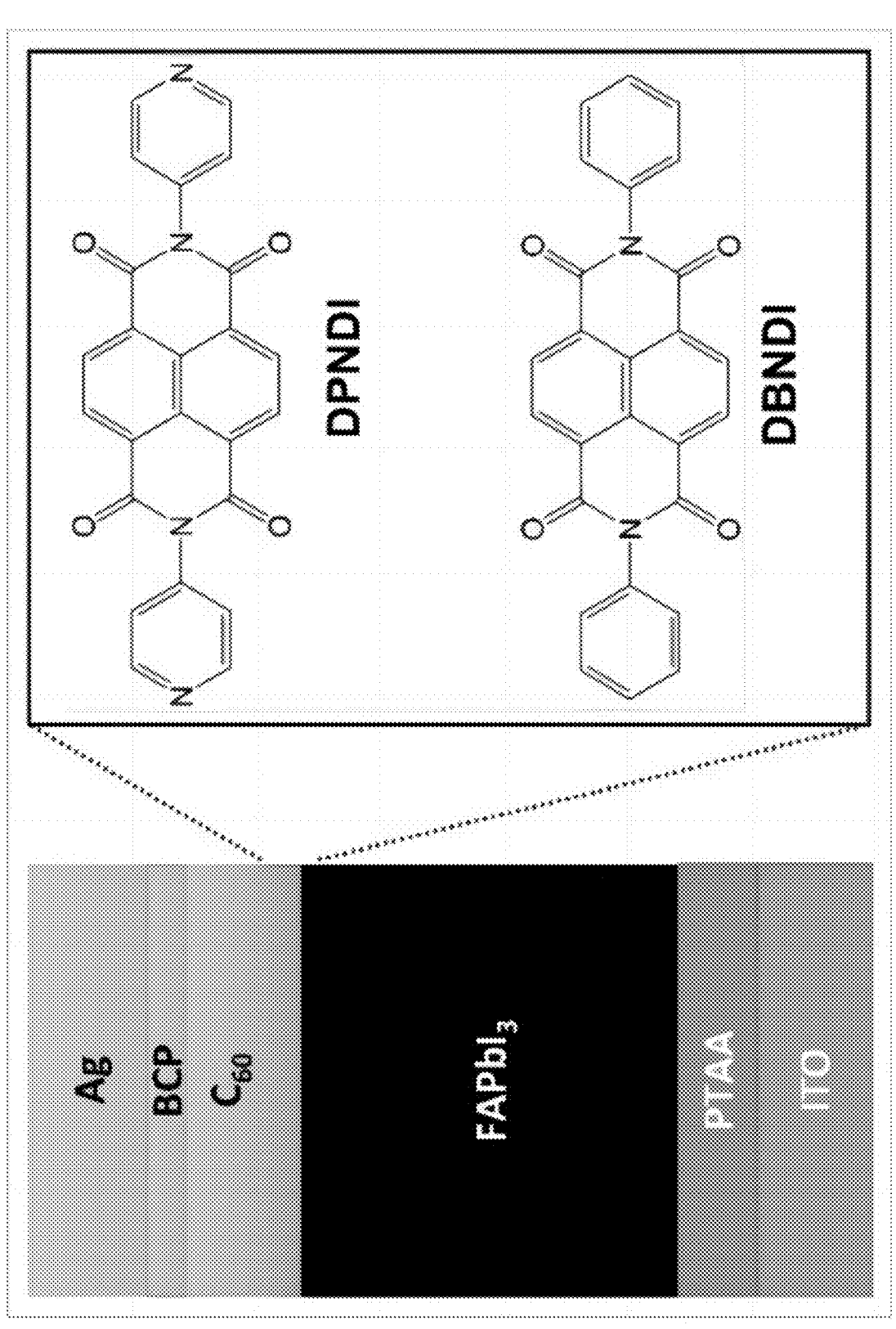
FIG. 1 is the schematic diagram of the structural components of the perovskite solar cells described in Embodiment 1 and Ratio 1 of the invention.

In order to make the purpose, technical scheme and effect of the invention more clear, the following embodiments are listed to further explain the invention in detail. It should be pointed out that the specific embodiments described here are only used to explain the invention and are not used to limit the invention.

The following is a detailed description of the technical scheme of the invention in combination with the drawings and the specific implementation methods.

Embodiment 1

The ITO glass substrate is washed by detergent, acetone and isopropanol for 15 minutes, and then it is dried by nitrogen and treated with ultraviolet-ozone for 30 minutes. The PTAA (2 mg/mL) is dissolved in toluene, and it is spin-coated on the ITO substrate at a speed of 4000 rpm for 30 seconds, then the substrate is annealed at a 100° C. hot plate for 10 minutes and cooled to room temperature. The 1.4 M perovskite precursor solution is prepared by mixing FAI, PbI$_2$ and 30 mol % MACI in a mixed solvent of DMF and DMSO (the volume ratio of DMF and DMSO is 9:1). The 50 μL perovskite precursor solution is spin-coated on the PTAA-ITO substrate at the speed of 1000 rpm (10 seconds) and 5000 rpm (30 seconds), and 200 μL chlorobenzene antisolvent is added dropwise to the surface 5 seconds before the end of spin-coating, then the PTAA-ITO substrate is annealed at a 150° C. hot plate for 15 minutes. 50 μL DPNDI solution (2 mg/mL in chlorobenzene) is spin-coated on the perovskite film at 5000 rpm for 30 seconds and the film is annealed on a 100° C. hot plate for 5 minutes. Finally, the C$_{60}$ with the thickness of 30 nm, the BCP with the thickness of 5 nm and the silver electrode with the thickness of 100 nm are successively evaporated.

Ratio 1.

The present ratio is basically the same as Embodiment 1, but the difference is that the DPNDI solution containing the pyridine end group is replaced by the DBNDI solution containing the benzene ring end group.

Ratio 2.

The present ratio is basically the same as Embodiment 1, but the difference is that there is no spin-coating DPNDI solution.

Embodiment 2

The P1 line is carved on the ITO substrate by laser. The ITO glass substrate is washed by detergent, acetone and isopropanol for 15 minutes, and then it is dried by nitrogen and treated with ultraviolet-ozone for 30 minutes. The PTAA solution is prepared by dissolving PTAA (2 mg/mL) in toluene, and then the PTAA solution is coated on the ITO glass substrate with a blade at a moving speed of 15 mm/s, the gap between the blade and the ITO glass substrate is 100 μm. The perovskite precursor solution is prepared by dissolving 1.3 M FAPbI$_3$ and 0.4 M MACI in a mixed solvent of DMF and NMP (the volume ratio is 1:1). Subsequently, the perovskite precursor solution is coated onto the PTAA-ITO glass substrate at a moving speed of 15 mm/s with a nitrogen knife, and the gap between the two is 300 μm. After that, the perovskite film is annealed on a 150° C. hot plate for 15 minutes in an air environment with a relative humidity of 35%, and then the film is cooled to room temperature. DPNDI (1 mg/mL) is dissolved in chlorobenzene to prepare DPNDI solution, and then the DPNDI solution is coated on the perovskite film with a blade at a moving speed of 30 mm/s, the gap between the blade and the perovskite film is 100 μm. Then the C$_{60}$ with the thickness of 30 nm and the BCP with the thickness of 5 nm are evaporated respectively. The deposited layer is carved into P2 line by laser, and the silver with the thickness of 100 nm is evaporated as an electrode to prepare a perovskite module containing DPNDI interface layer.

The specific test results are as follows:

FIG. 1 is the schematic diagram of the structural components of the perovskite solar cells described in Embodiment 1 and Ratio 1 of the invention.

Figure 2:
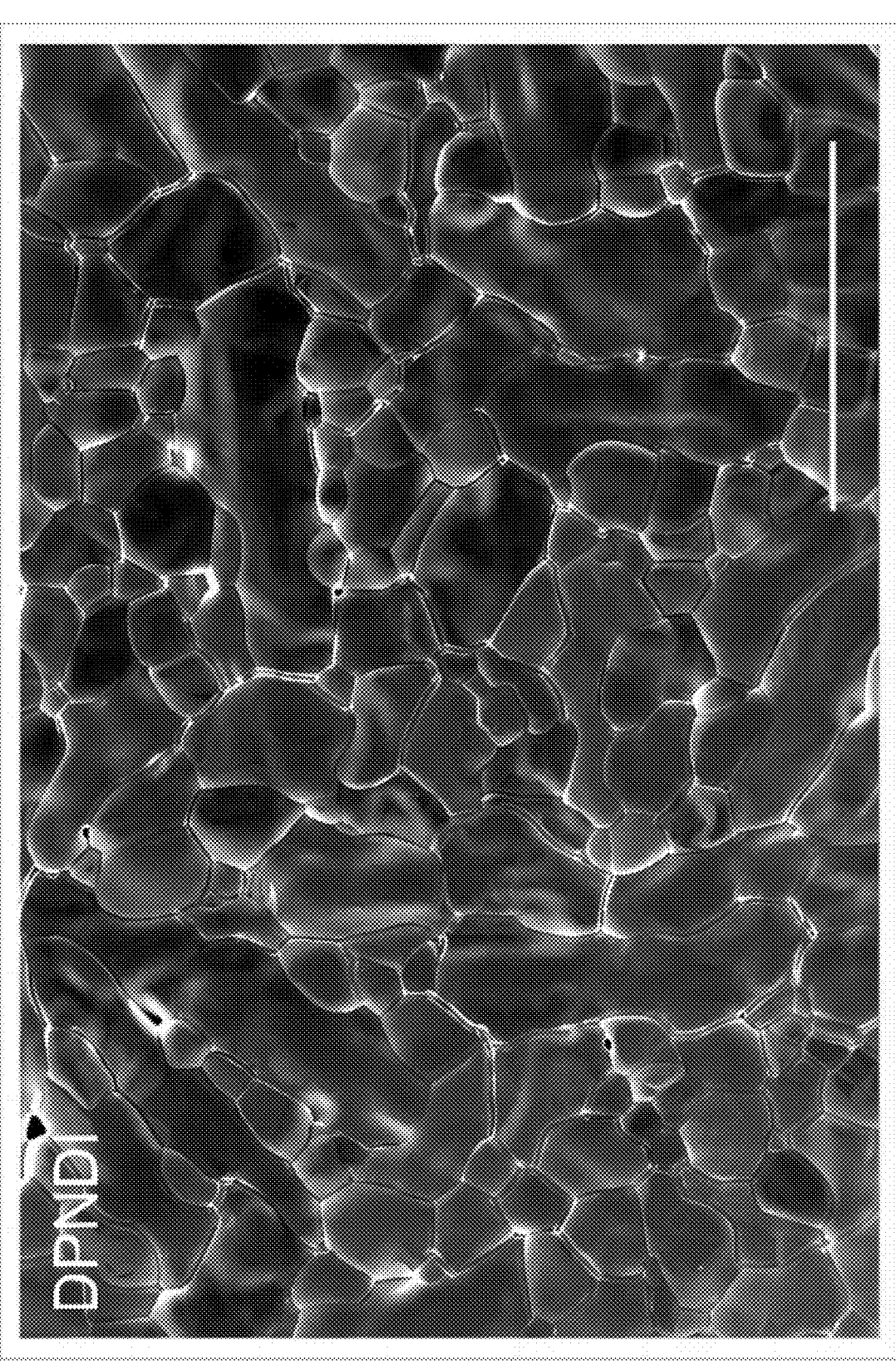
FIG. 2 is the scanning electron microscope (SEM) top view of the perovskite film containing DPNDI interface layer in Embodiment 1 of the invention, and the scale size is 5 μm.

FIG. 2 is the SEM top view of the perovskite film containing DPNDI interface layer in Embodiment 1 of the invention, and the scale size is 5 μm. After DPNDI treatment, the surface grains are more uniform, the brightness of PbI$_2$ clusters is reduced, and the holes are less.

Figure 3:
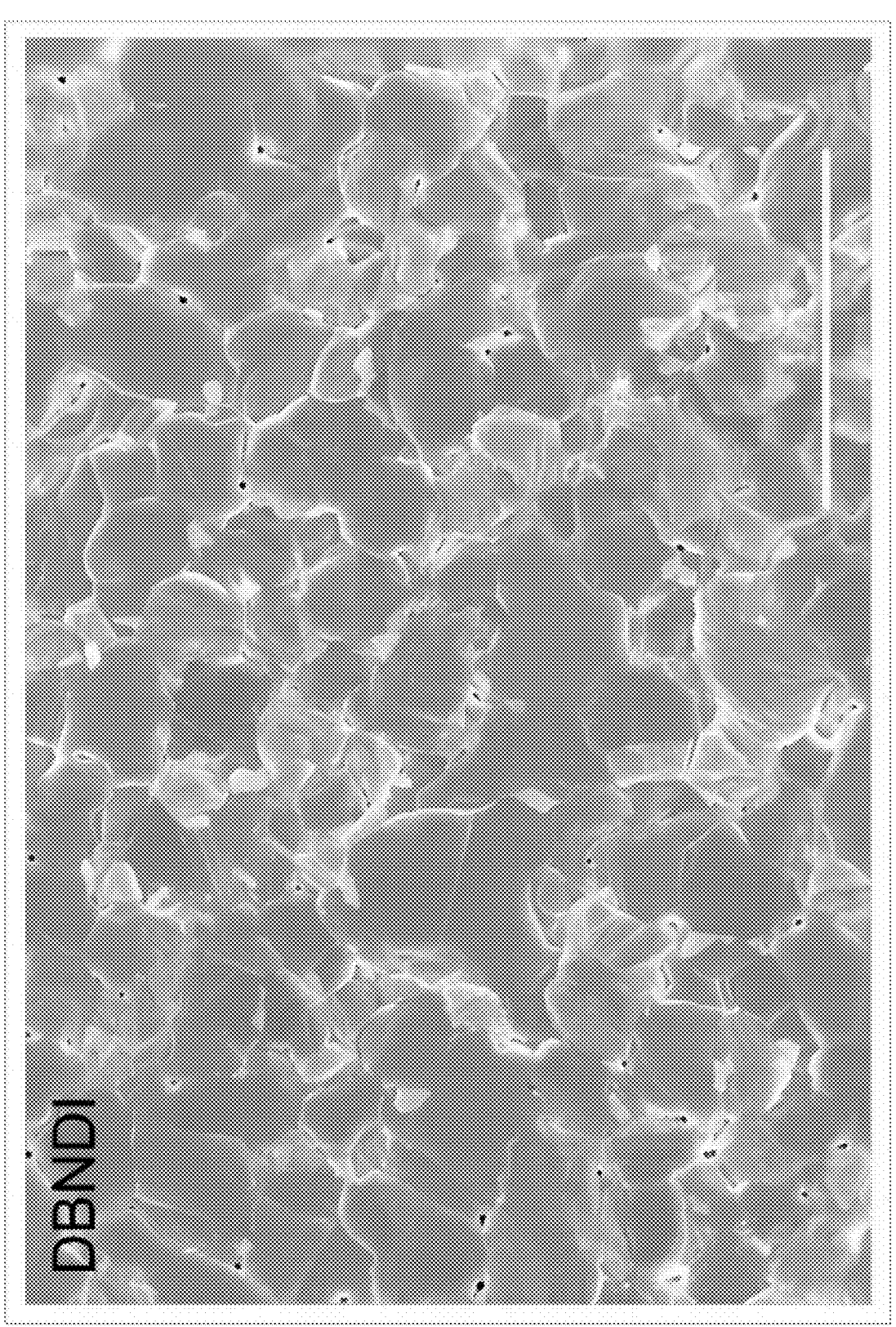
FIG. 3 is the SEM top view of the perovskite film containing DBNDI interface layer in Ratio 1 of the invention, and the scale size is 5 μm.

FIG. 3 is the SEM top view of the perovskite film containing DBNDI interface layer in Ratio 1 of the invention, and the scale size is 5 μm. The surface of the DBNDI-modified perovskite film shows bright PbI$_2$ clusters and holes.

Figure 4:
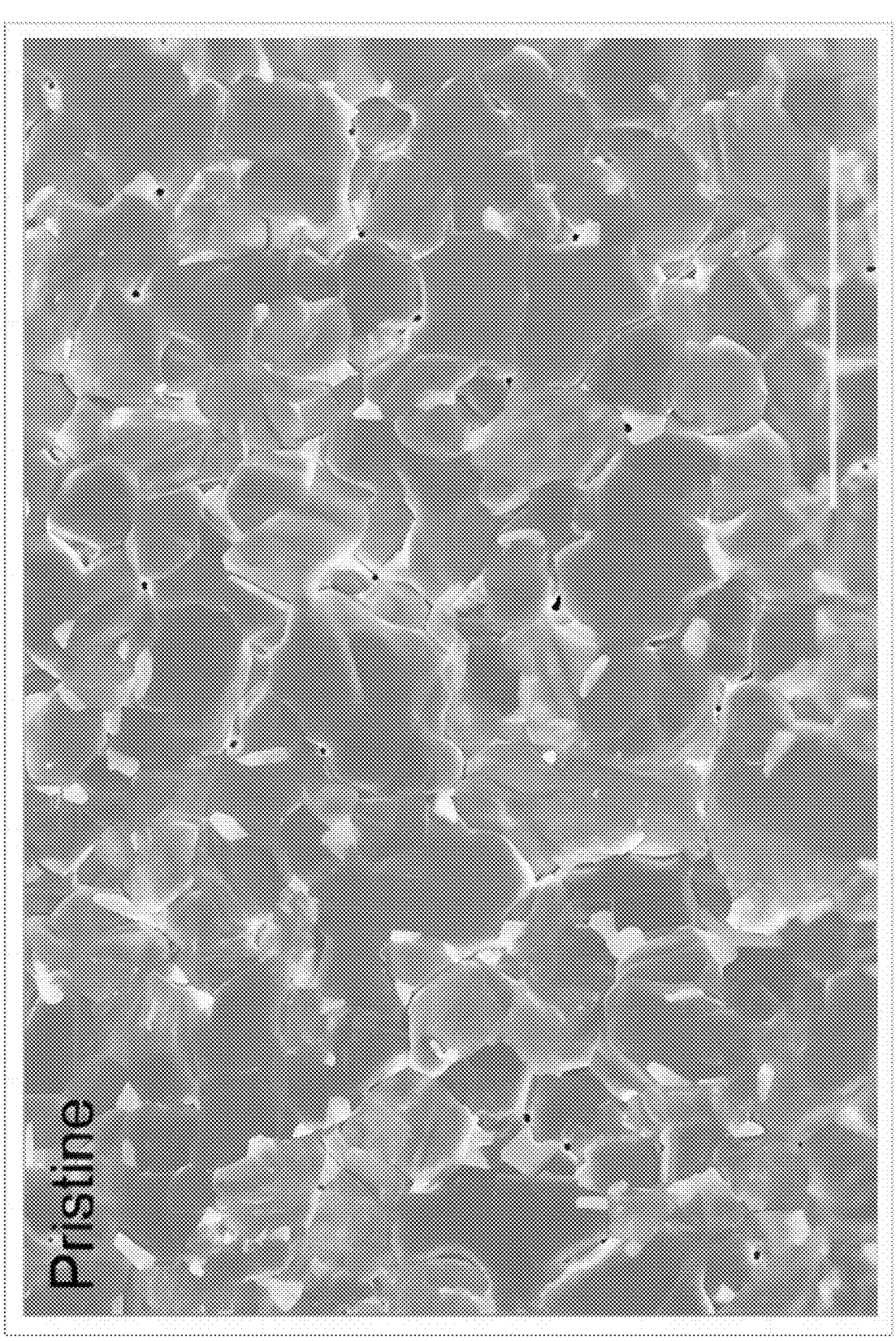
FIG. 4 is the SEM top view of the pristine perovskite film in Ratio 2 of the invention, and the scale size is 5 μm.

FIG. 4 is the SEM top view of the pristine perovskite film in Ratio 2 of the invention, and the scale size is 5 μm. The surface of the pristine perovskite film shows bright PbI$_2$ clusters and holes.

Figure 5:
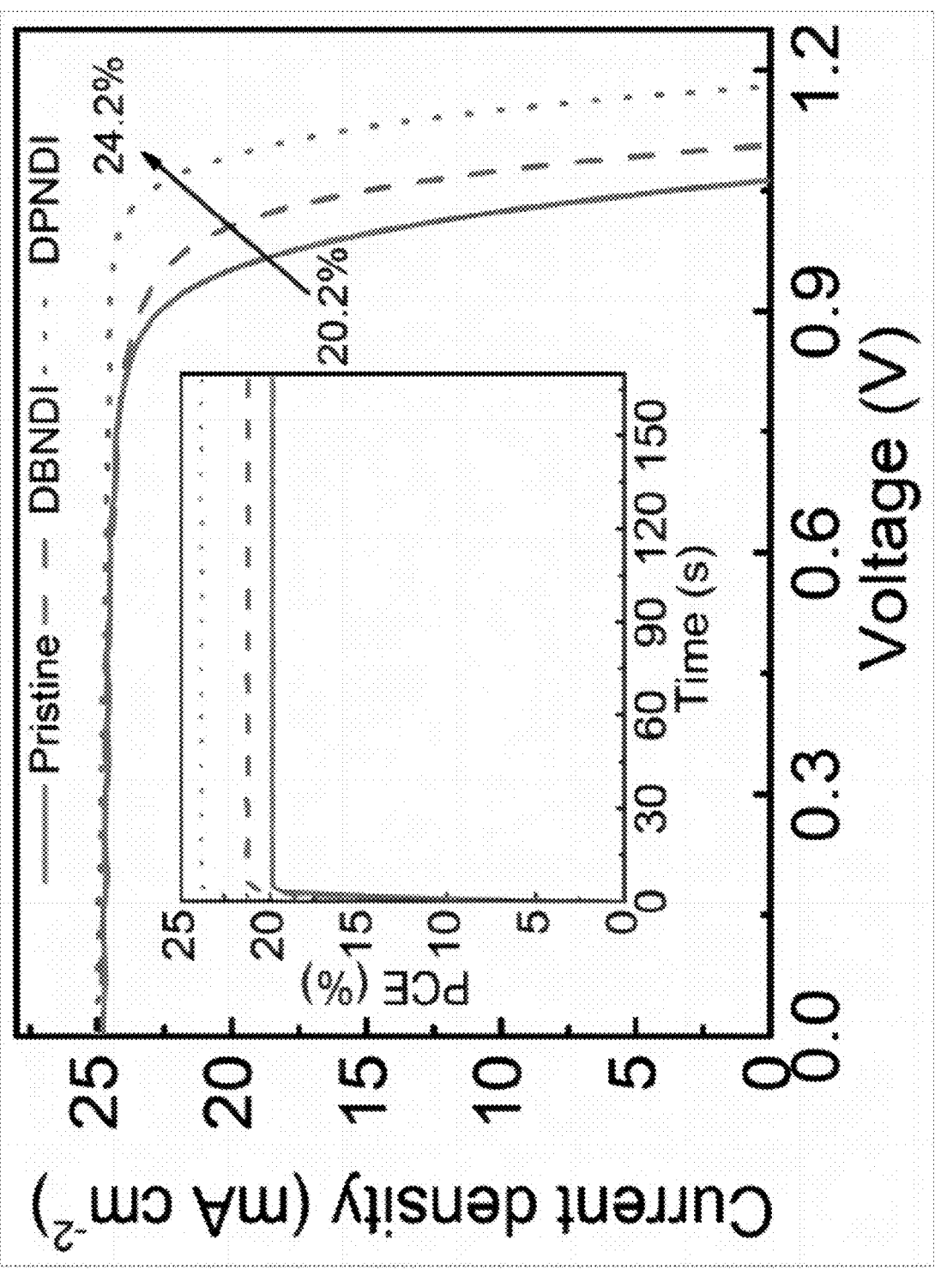
FIG. 5 is the current-density versus voltage (J-V) curve diagram of the pristine PSC and the PSCs containing DPNDI or DBNDI interface layer prepared in Embodiment 1, Ratio 1 and Ratio 2 of the invention (the illustration shows the stable relationship between the photoelectric conversion efficiency of the three with time).

FIG. 5 is the J-V curve diagram of the pristine PSC and the PSCs containing DPNDI or DBNDI interface layer prepared in Embodiment 1, Ratio 1 and Ratio 2 of the invention (the illustration shows the stable relationship between the photoelectric conversion efficiency of the three with time). The PCE of the pristine PSC and the DBNDI-modified PSC are 20.2% and 21.6% respectively, while the PCE of DPNDI-modified PSC reaches an impressive 24.2%.

Figure 6:
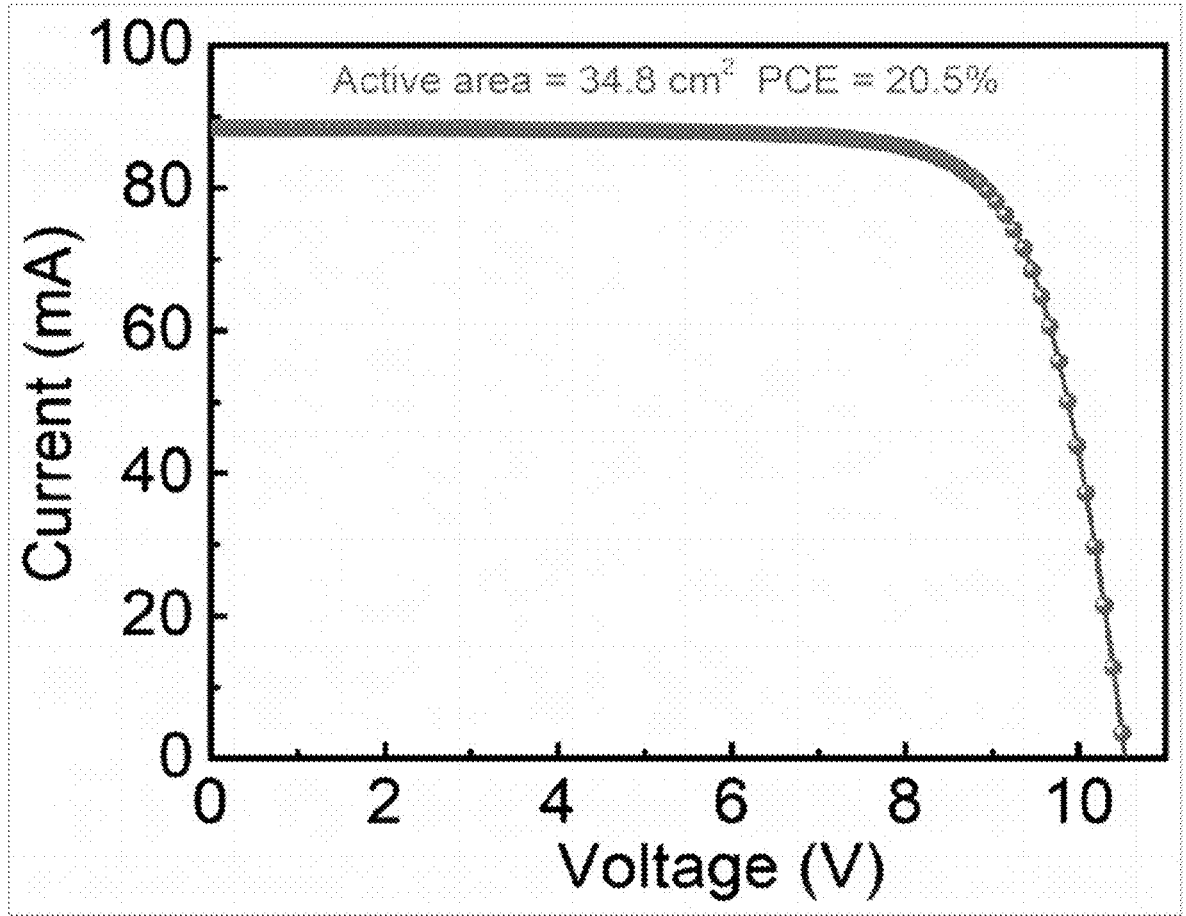
FIG. 6 is the J-V curve diagram of the perovskite solar module containing the DPNDI interface layer described in Embodiment 2 of the invention (the effective area of the module is 34.8 cm$^2$, and the illustration is the optical photo of the corresponding module)

FIG. 6 is the J-V curve diagram of the perovskite solar module containing the DPNDI interface layer described in Embodiment 2 of the invention (the effective area of the module is 34.8 cm$^2$, and the illustration is the optical photo of the corresponding module). The open circuit voltage ($V_{OC}$) of the module is 10.5 V, the short circuit current ($I_{SC}$) is 88.4 mA, and the fill factor (FF) is 0.77.

Figure 7:
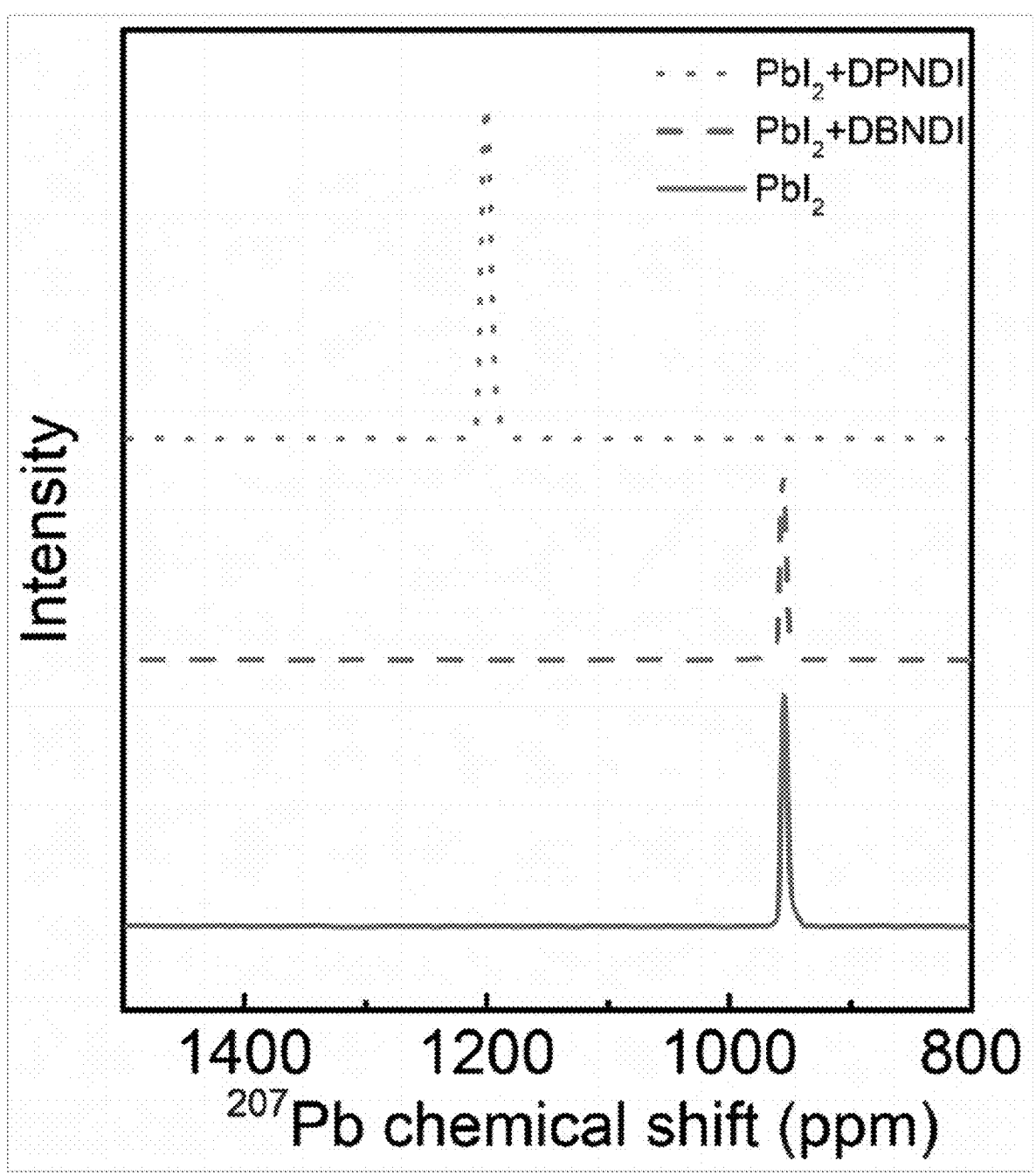
FIG. 7 shows the $^{207}$Pb NMR spectra of pure PbI$_2$, DBNDI and PbI$_2$, DPNDI and PbI$_2$ solutions in DMF.

FIG. 7 shows the $^{207}$Pb NMR spectra of pure PbI$_2$, DBNDI and PbI$_2$, DPNDI and PbI$_2$ solutions in DMF. Compared with PbI$_2$ (955 ppm), DPNDI/PbI$_2$ shows a signal at 1200 ppm due to the substitution of iodide by the nitrogen atom with stronger electronegativity in the DPNDI molecule.

Figure 8:
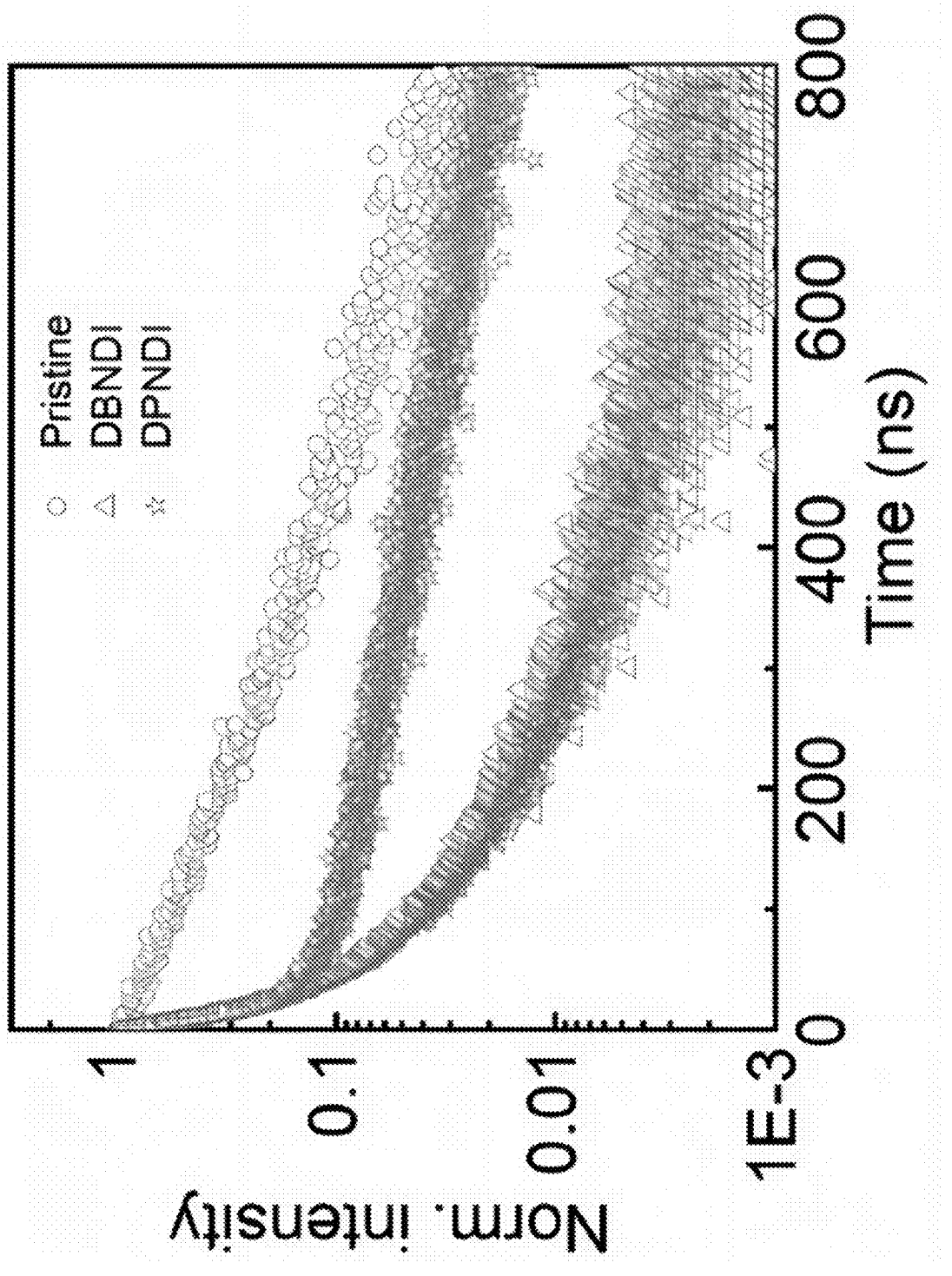
FIG. 8 shows the time-resolved photoluminescence (TRPL) kinetic images of pure FAPbI$_3$, FAPbI$_3$/DPNDI and FAPbI$_3$/DBNDI films.

FIG. 8 shows the time-resolved photoluminescence (TRPL) kinetic images of pure FAPbI$_3$, FAPbI$_3$/DPNDI and FAPbI$_3$/DBNDI films. Compared with the pristine sample, FAPbI$_3$ modified by DPNDI and DBNDI has longer carrier lifetime.

Figure 9:
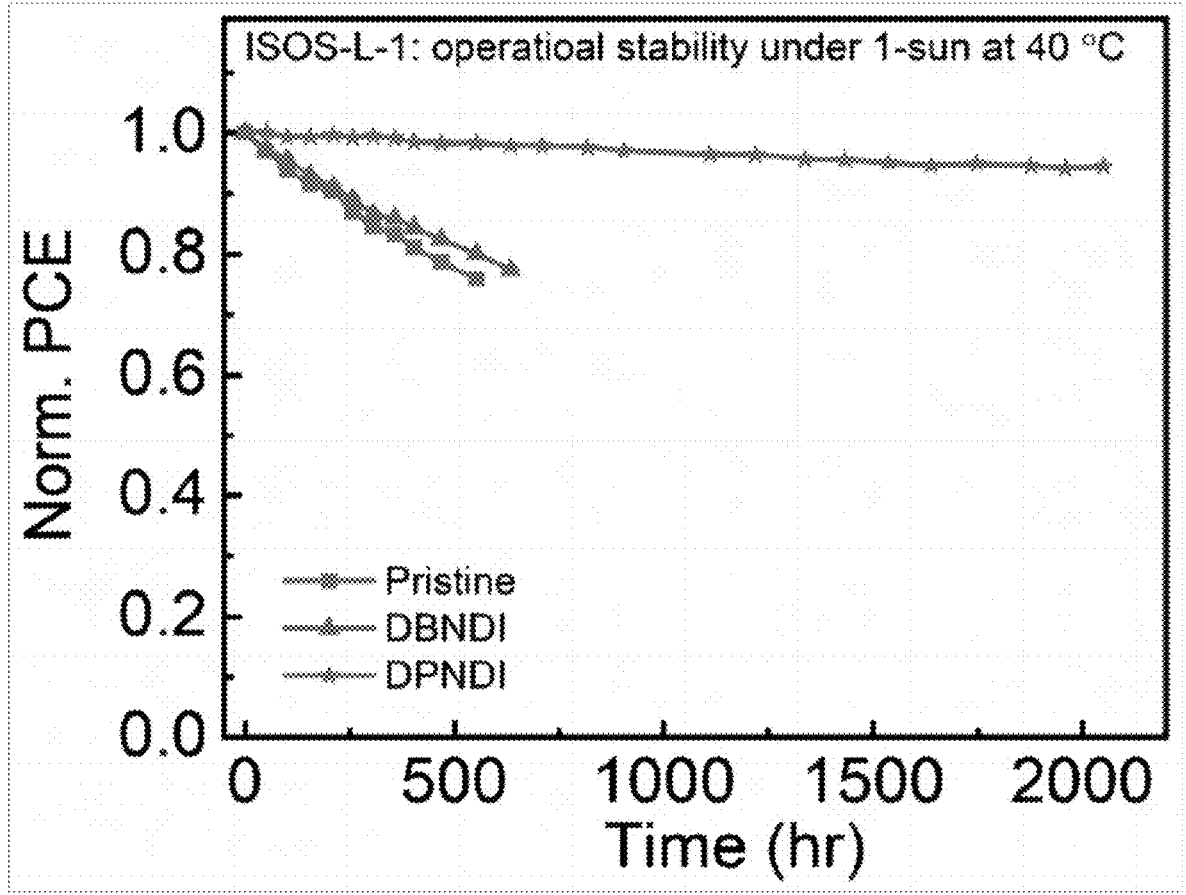
FIG. 9 is the function image of normalized PCE with aging time (air environment, 40° C., 1 constant sun illumination) of pristine and packaged PSCs containing DPNDI or DBNDI interface layers prepared in Ratio 1 and Ratio 2 under MPP tracking.

FIG. 9 is the function image of normalized PCE with aging time (air environment, 40° C., 1 constant sun illumination) of the pristine PSC and the packaged PSC containing DPNDI or DBNDI interface layer prepared in Ratio 1 and Ratio 2 under MPP tracking. The T$_{80}$ lifetime of pristine and DBNDI-modified solar cells is 400 hours, while the PCE of DPNDI-modified PSC still exceeds 95% of the initial value after 2000 hours of operation.

Figure 10:
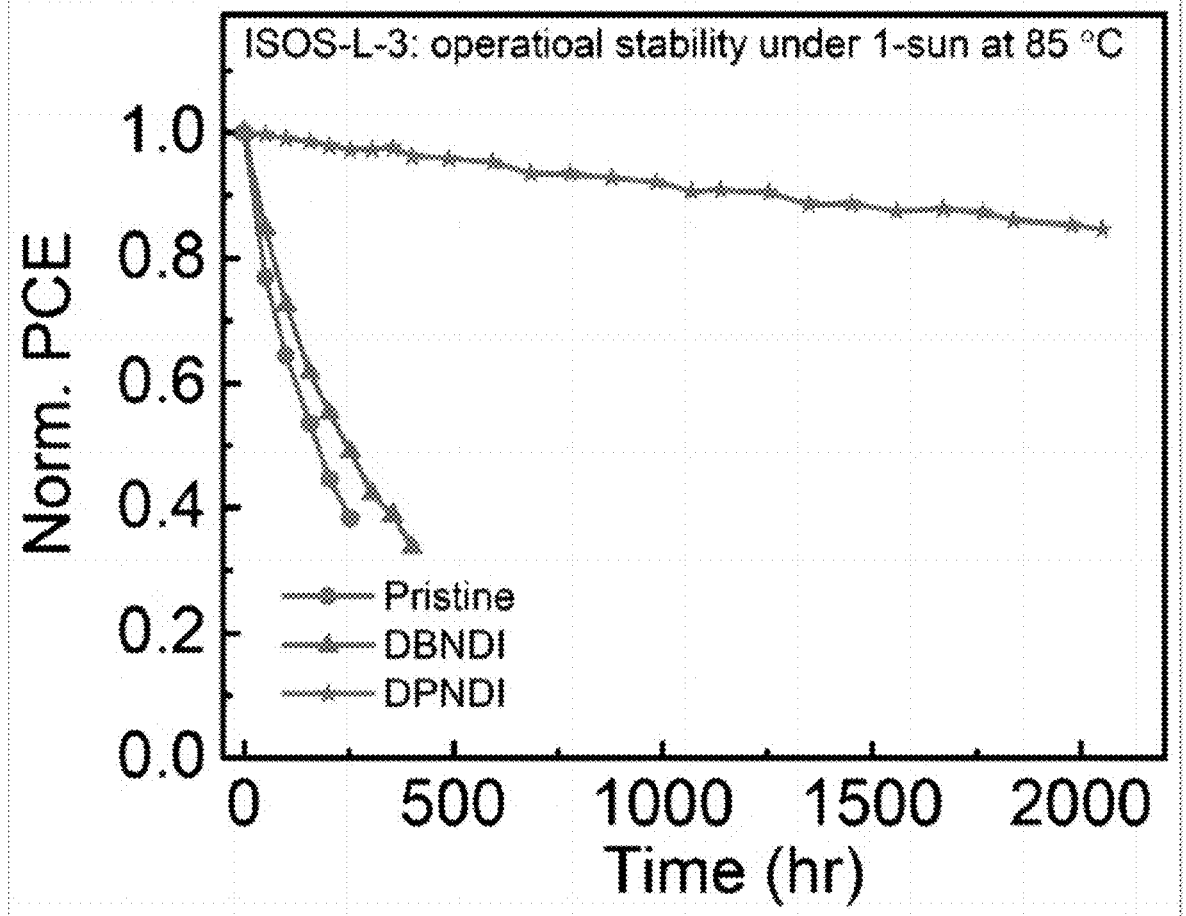
FIG. 10 is the function image of normalized PCE with aging time (air environment, 85° C., 1 constant sun irradiation) of the pristine PSC and the packaged PSC containing DPNDI or DBNDI interface layer prepared by Ratio 1 and Ratio 2 under MPP tracking.

FIG. 10 is the function image of normalized PCE with aging time (air environment, 85° C., 1 constant sun irradiation) of the pristine PSC and the packaged PSC containing DPNDI or DBNDI interface layer prepared in Ratio 1 and Ratio 2 under MPP tracking. The PCE of pristine and DBNDI-modified perovskite solar cells decay rapidly within 100 hours, but the DPNDI-modified cell shows stronger robustness, and maintains more than 85% of its initial PCE after 2000 hours.

Embodiment 3

The ITO glass substrate is washed by detergent, acetone and isopropanol for 15 minutes respectively, then it is dried by nitrogen and treated by ultraviolet-ozone for 30 minutes. Then the C$_{60}$ (1 mg/mL, diluted by DCB) is spin-coated on the ITO glass substrate at a speed of 3000 rpm, and the substrate is annealed at a 80° C. hot plate for 30 minutes and then cooled to room temperature. Further, 67 mM KCl aqueous solution is spin-coated on the substrate at a speed of 5000 rpm for 30 seconds, and the substrate is annealed at a 150° C. hot plate for 15 minutes. The 1.35 M methylammonium iodide (MAI) and PbI$_2$ solution are dissolved in DMF:NMP (the volume ratio is 95:5), after that, the solution is spin-coated on the substrate at a speed of 1500 rpm for 30 seconds, and the substrate is annealed on a 150° C. hot plate for 15 minutes. 50 μL DPNDI solution (2 mg/mL in chlorobenzene) is spin-coated on the perovskite film at a speed of 5000 rpm for 30 seconds and the film is annealed on a 100° C. hot plate for 5 minutes. Subsequently, WO$_3$ (2 w %) is dissolved in isopropanol to prepare WO$_3$ solution. The WO$_3$ solution is spin-coated on the perovskite film after gas phase surface treatment at a speed of 3000 rpm for 30 seconds and then film is annealed on a 50° C. hot plate for 5 minutes to prepare a hole transport layer. Finally, a gold electrode with the thickness of 100 nm is evaporated on the top of the sample to complete the preparation of the perovskite solar cells.

Embodiment 4

The ITO glass substrate is washed by detergent, acetone, and isopropanol for 15 minutes respectively, then it is dried by nitrogen and treated by ultraviolet-ozone for 30 minutes, and then the PEDOT:PSS film is deposited. For the preparation of FASnI$_3$ perovskite film, the perovskite precursor solution composed of 1M SnI$_2$,1M FAI and 0.1M SnF$_2$ is first stirred in DMSO at room temperature for 2 hours. The precursor solution is spin-coated on the substrate at a speed of 4000 rpm for 48 seconds, and then it is spin-coated on the substrate at a speed of 5000 rpm for 48 seconds. At the 30th second of the second step, 80 μL of chlorobenzene is spin-coated onto the perovskite film. Then the perovskite film is then annealed at 60° C. and 100° C. for 10 seconds and 12 minutes respectively. The 50 μL DPNDI solution (2 mg/mL in chlorobenzene) is spin-coated on the perovskite film at a speed of 5000 rpm for 30 seconds and annealed on a 100° C. hot plate for 5 minutes. Finally, the C$_{60}$ with the thickness of 60 nm, the BCP with the thickness of 7 nm and the silver electrode with the thickness of 80 nm are successively evaporated.

The above are only the preferred implementation methods of the invention, it should be pointed out that for the ordinary technicians in the technical field, some improvements can be made without breaking away from the principle of the invention, and these improvements should also be regarded as the protection scope of the invention.

What is claimed is:

1. A preparation method for a perovskite solar cell modified by a chelating layer, comprising:

spin-coating N,N'-bis(4-pyridyl)-1,4,5,8-naphthalenetetracarboxylic diimide (DPNDI) solution on a surface of a halide perovskite of the perovskite solar cell and annealing the surface;

using a strong coordination ability of pyridine with metal ions in a perovskite layer, packaging the pyridine with an end group of DPNDI molecule on a perovskite surface to form a Pb (II) coordination polymer with strong chemical bond, so as to passivate surface defects of the halide perovskite and promote an effect of interface charge transfer, thereby improving a photoelectric conversion efficiency and an operational stability of the perovskite solar cell.

2. The preparation method for the perovskite solar cell modified by the chelating layer according to claim 1, the perovskite comprising all two-dimensional (2D) and three-dimensional (3D) halide perovskites;

a structure of a 2D halide perovskite is A'$_m$A$_{n-1}$B$_n$X$_{3n+1}$, wherein A' represents a monovalent or divalent organic cation that separates one group of perovskite layers from another group of perovskite layers, and n is an integer of at least 1 denoting a number of perovskite layers between A' organic layers; A is one or more of cesium (Cs), methylammonium (MA), formamidinium (FA), B is one or more of Pb, Sn, Ge, and X is one or more of I, Br, Cl, F; and a structure of a 3D halide perovskite is ABX$_3$, wherein A is one or more of Cs, MA and FA, B is one or more of Pb, Sn and Ge, and X is one or more of I, Br, Cl and F.

3. The preparation method for the perovskite solar cell modified by the chelating layer according to claim 1, wherein the DPNDI solution comprises a solvent selected from one or more of chlorobenzene, ethyl acetate, and anisole; wherein a concentration of the DPNDI solution is 1-10 mg/mL.

4. The preparation method for the perovskite solar cell modified by the chelating layer according to claim 1, wherein, a spin-coating speed is 1000-10000 rpm.

5. The preparation method for the perovskite solar cell modified by the chelating layer according to claim 1, wherein, an annealing temperature is 30-200° C., and an annealing time is 1-10 min.

6. The preparation method for the perovskite solar cell modified by the chelating layer according to claim 1, wherein a core functional layer of the perovskite solar cell is one selected from a formal structure and an inverted structure, an arrangement order of the formal structure is an electron transport layer, a perovskite light-absorption layer and a hole transport layer from bottom to top; an arrangement order of the inverted structure is a hole transport layer, a perovskite light-absorption layer and an electron transport layer from bottom to top.

7. The preparation method for the perovskite solar cell modified by the chelating layer according to claim 6, wherein a chelating structure is formed on the surface of the halide perovskite of the perovskite solar cell, and wherein the chelating structure passivates defect sites at a surface and grain boundaries, and has appropriate energy level and carrier mobility to promote interface charge transfer; and the Pb (II) coordination polymer with strong chemical bond improves bonding strength and adhesion of the surface, which shows a strong trap suppression ability.

* * * * *